United States Patent [19]

Schulke

[11] Patent Number: 4,497,277

[45] Date of Patent: Feb. 5, 1985

[54] BELL OF OPAQUE FUSED SILICA

[75] Inventor: Karl A. Schulke, Neuberg, Fed. Rep. of Germany

[73] Assignee: Heraeus-Quarzschmelze, Hanau am Main, Fed. Rep. of Germany

[21] Appl. No.: 467,998

[22] Filed: Feb. 18, 1983

[30] Foreign Application Priority Data

Mar. 9, 1982 [DE] Fed. Rep. of Germany ....... 3208381

[51] Int. Cl.³ .............................................. C23C 13/08
[52] U.S. Cl. .................................... 118/733; 118/715; 118/724; 432/251
[58] Field of Search ............... 118/715, 733, 725, 724, 118/50.1; 432/251; 34/92; 373/112

[56] References Cited

U.S. PATENT DOCUMENTS

| 2,858,795 | 11/1958 | Walker | 34/92 |
| 2,862,307 | 12/1958 | Bloomer et al. | 34/92 |
| 3,492,969 | 2/1970 | Emeis | 118/715 |
| 3,701,682 | 10/1972 | Gartman et al. | 118/725 X |
| 4,081,236 | 3/1978 | Corbett | 432/251 X |

FOREIGN PATENT DOCUMENTS 53-26283 3/1978 Japan .................................. 118/725

OTHER PUBLICATIONS

*Quartz Glass for the Semi-Conductor Technology*, Pamphlet #Q-B 3/113, Heraeus Quarzschmelze GmbH, West Germany, Sep. 1979.
Wade Technical Report 59-363, Found in "U.S. Govt. Research Reports", vol. 33, No. 5, p. 495, 5-13-1960.
Roth, "*Vacuum Sealing Techniques*, Pergamon Press, 1966, pp. 30, 306, 307, 324 and 325.

*Primary Examiner*—John D. Smith
*Assistant Examiner*—Bernard F. Plantz
*Attorney, Agent, or Firm*—Felfe & Lynch

[57] ABSTRACT

A bell made of opaque fused silica and intended for use in the deposition of polycrystalline silicon is assembled from at least three individual sections. The sections are joined to one another at end flanges with gaskets between the flanges. The lengths of the individual sections are determined by the temperature distribution along the bell in use.

20 Claims, 4 Drawing Figures

BELL OF OPAQUE FUSED SILICA

BACKGROUND OF THE INVENTION

The invention relates to a bell made of opaque fused silica, preferably for use in the deposition of polycrystalline silicon and with an inside diameter of over 500 mm and a height of over 1300 mm.

From pamphlet Q-B 3/113 (September, 1979), pp. 8-9, of Heraeus Quarzschmelze GmbH there are known one-piece bells made of opaque fused silica (a fused product, obtained primarily from quartz sands and therefore of lower purity, and containing finely dispersed air bubbles that render it nontransparent). They are for the deposition of polycrystalline silicon and have inside diameters ranging from 500 to 900 mm and heights of up to 2200 mm.

In the deposition of polycrystalline silicon, the bells are heated at widely differing rates over their length due to the nature of the process; the two ends remain considerably cooler than the highly heated middle zone. Especially in the case of larger bells, this results in stresses and fractures due to hindered thermal expansion.

SUMMARY OF THE INVENTION

The present invention has as its object providing a bell made of opaque fused silica which exhibits good expansion capability in the presence of temperature differences, especially in the case of larger bells preferably for the deposition of polycrystalline silicon.

In accordance with the invention, this object is accomplished by assembling a bell from at least three sections (a center section and two end sections) which are joined to one another by flanges. For use in a high temperature process, preferably depositing polycrystalline silicon, the center section is substantially longer than the other sections and, in operation, encloses the highest-temperature zone. Still more preferably, an intermediate section is disposed between the center section and each end section, the length of said intermediate section being no greater than the length of the end section to which it is joined. The length of the center section is preferably at least 1.5 times the length of either end section and, still more preferably, about twice the length of either end section when the bell is assembled from three sections, or of the sum of the lengths of either end section and its intermediate section when the bell is assembled from five sections. A gasket, preferably made of mineral fibers or of a soft-annealed metal, is perferably disposed between contacting flat flange faces which preferably join the sections to one another. All the sections are preferably also provided with an inner liner of transparent fused quartz and, preferably, of transparent synthetic vitreous silica.

The bell constructed in accordance with the invention has advantages. By assembling it from several sections, provision is made for expansion which, in the region of high temperature gradients, reduces the susceptibility of the bell to fracture, especially in the case of larger bells over 500 mm in diameter. The service life of the bell is thus extended. Also, when fractures do occur, only the bell sections involved need be replaced. Further, assembling the bell from individual sections makes it possible to build far larger structural units than up to now without the need to expand the production facilities and without an increase in production risk because the sizes of all sections are still within a manageable range.

DESCRIPTION OF THE DRAWINGS

Preferred embodiments which are intended to illustrate but not to limit the invention will now be described with reference to the following drawings, in which.

DETAILED DESCRIPTION OF THE PREFERRED EMBODIMENTS

Figures 1, 2:
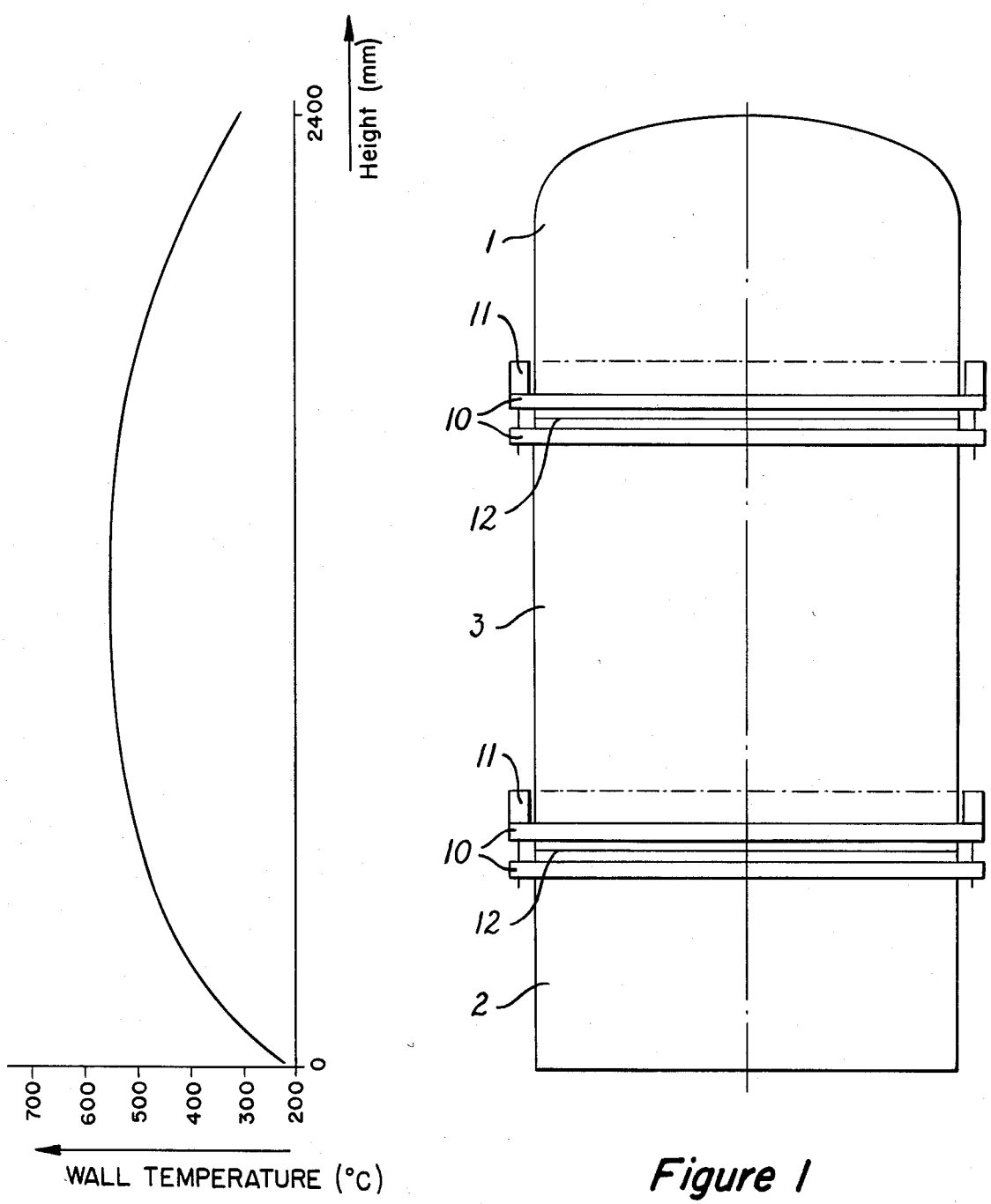
FIG. 1 shows diagrammatically a three-section bell.
FIG. 2 shows a temperature curve associated with the bell in FIG. 1 in operation.

As in apparent form FIG. 1, the bell consists of three sections, namely, a dish-shaped end section 1, a tubular end section 2, and a tubular center section 3. The latter is provided with two flanges 10, and the end sections 1 and 2 with one flange 10 each. Alternatively, the end section 2 may be provided with two flanges 10 so that the bell can be mounted on a base. The length of the center section is 1100 mm, which is about twice the length of either end section. The overall length is 2400 mm. Disposed between the sections 1 and 3 and 3 and 2 are gaskets 12 made, for example, of mineral fibers, a soft metal such as copper, or soft-annealed silver in the form of round wire. The individual sections are centered and held to each other by means of bolts 11.

Figures 3, 4:
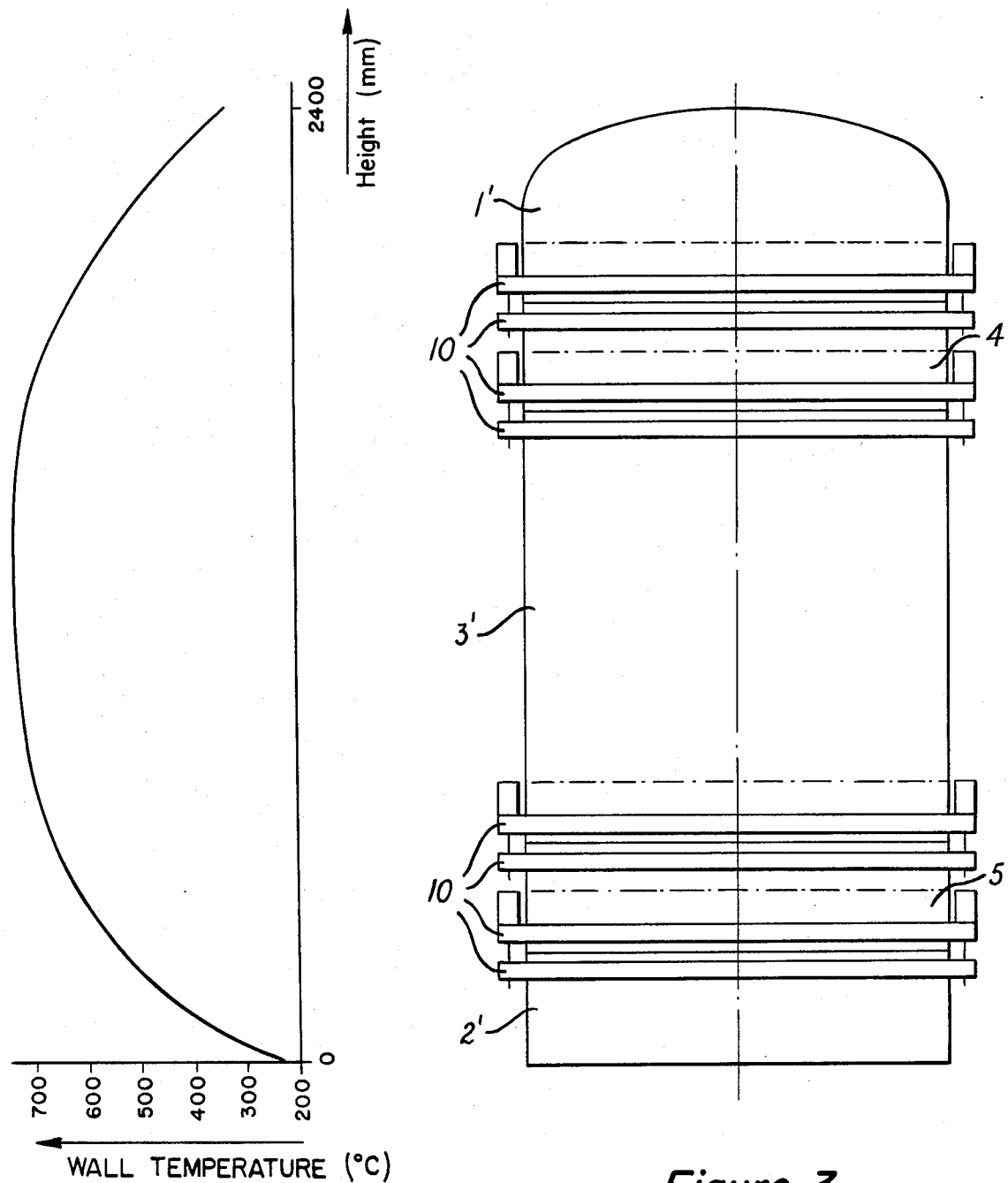
FIG. 3 shows diagrammatically a five-section bell.
FIG. 4 shows a temperature curve associated with the bell in FIG. 3 in operation.

In contrast to the bell shown in FIG. 1, the bell of FIG. 3 further comprises two tubular intermediate sections 4 and 5. The tubular sections 3', 4 and 5 are provided with two end flanges 10 each, and the end sections 1' and 2' with one end flange 10. Alternatively, the end section 2' may be provided with two flanges 10, as before. The length of the center section is 1100 mm, which is about twice the sum of the length of the intermediate section 5 and of the end section 2', or of the intermediate section 4 and the end section 1'. The overall length is 2400 mm. The individual sections are gasketed and joined together as described in connection with FIG. 1. All sections are provided with an inner liner of transparent fused quartz.

The bell sections are produced from quartz sand by the method known from German Pat. No. 543,957. The length of the individual sections is determined by the temperature distribution to be anticipated from the use of the bell. The individual sections must be of such length that regions with nearly constant temperature are separated from regions with high or even very high temperature gradients. Shown in FIG. 2 is the temperature curve of the bell in FIG. 1 in an operation, from which it is readily apparent where the joints between the end sections 1 and 2 with high temperature gradients and the relatively uniformly heated center section 3 are to be located. FIG. 4 shows the temperature curve with substantially higher thermal loading of the bell in FIG. 3 than in FIGS. 1 and 2. Here, too, joints are provided between the center section 3, which is at a relatively uniform temperature (although higher than in FIG. 1), and the outlying regions where the temperature gradients are very high. This is why further joints are provided, namely between end section 1' and intermediate section 4 and between end section 2' and intermediate section 5. The higher the temperature gradients, the more sections are required since there should be no temperature differences exceeding 300° C. between closely adjacent regions of a section.

It will be appreciated that the specification sets forth the invention by way of illustration; various changes and modifications may be made without departing from the spirit and scope of the invention as defined by the following claims.

What is claimed is:

1. A bell of opaque fused silica for use in a high-temperature process, preferably the deposition of silicon, comprising: a dish-shaped end section; a tubular center section; a tubular end section; and means on the ends of the sections comprising a flange on at least one section to be joined to another for joining the sections together in the order recited, the tubular center section being substantially longer than the other sections, whereby to enclose the zone of highest temperature in the high-temperature process, and all the sections being of a diameter over 500 mm.

2. A bell as in claim 1, and additionally comprising at least one intermediate tubular section intermediate the tubular center section and one of the end sections and having a length not greater than the length of the end section to which it is joined; and means comprising a flange for joining it to the end section and the tubular center section.

3. A bell as in claim 1, wherein the tubular center section is not less than 1.5 times the length of either end section.

4. A bell as in claim 2, wherein the tubular center section is not less than 1.5 times the length of either end section and any intermediate section to which it is joined.

5. A bell as in claim 3, wherein the tubular center section is about twice the length of either end section.

6. A bell as in claim 4, wherein the tubular center section is about twice the length of either end section and any intermediate section to which it is joined.

7. A bell as in claim 1, wherein the means for joining the sections further comprises a gasket between each pair of sections joined made from at least one material selected from the group consisting of mineral fibers, a soft metal and a soft-annealed metal.

8. A bell as in claim 2, wherein the means for joining the sections further comprises a gasket between each pair of sections joined made from at least one material selected from the group consisting of mineral fibers, a soft metal, and a soft-annealed metal.

9. A bell as in claim 3, wherein the means for joining the sections further comprises a gasket between each pair of sections joined made from at least one material selected from the group consisting of mineral fibers, a soft metal, and a soft-annealed metal.

10. A bell as in claim 4, wherein the means for joining the sections further comprises a gasket between each pair of sections joined made from at least one material selected from the group consisting of mineral fibers, a soft metal, and a soft-annealed metal.

11. A bell as in claim 5, wherein the means for joining the sections further comprises a gasket between each pair of sections joined made from at least one material selected from the group consisting of mineral fibers, a soft metal, and a soft-annealed metal.

12. A bell as in claim 6, wherein the means for joining the sections further comprises a gasket between each pair of sections joined made from at least one material selected from the group consisting of mineral fibers, a soft metal, and a soft-annealed metal.

13. A bell as in claim 1, wherein each flange has a flat face for joining the sections.

14. A bell as in claim 2, wherein each flange has a flat face for joining the sections.

15. A bell as in claim 3, wherein each flange has a flat face for joining the sections.

16. A bell as in claim 7, wherein each flange has a flat face for joining the sections.

17. A bell as in claim 1, and further comprising a lining selected from the group consisting of transparent fused quartz and transparent synthetic vitreous silica on the inside of each section.

18. A bell as in claim 2, and further comprising a lining selected from the group consisting of transparent fused quartz and transparent synthetic vitreous silica on the inside of each section.

19. A bell as in claim 3, and further comprising a lining selected from the group consisting of transparent fused quartz and transparent synthetic vitreous silica on the inside of each section.

20. A bell as in claim 7, and further comprising a lining selected from the group consisting of transparent fused quartz and transparent synthetic vitreous silica on the inside of each section.

* * * * *